US006348386B1

(12) United States Patent
Gilmer

(10) Patent No.: US 6,348,386 B1
(45) Date of Patent: Feb. 19, 2002

(54) METHOD FOR MAKING A HAFNIUM-BASED INSULATING FILM

(75) Inventor: David Christopher Gilmer, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/836,668

(22) Filed: Apr. 16, 2001

(51) Int. Cl.[7] ............... H01L 21/336; H01L 21/3205
(52) U.S. Cl. ................. 438/288; 438/591; 438/770
(58) Field of Search ................ 438/287, 288, 438/591, 770, 305, 306, 513, 636, 769, 785; 257/408, 344, 345, 400, 327, 368

(56) References Cited

U.S. PATENT DOCUMENTS

| | | | | |
|---|---|---|---|---|
| 4,015,281 A | * | 3/1977 | Nagata et al. | 357/41 |
| 5,355,011 A | * | 10/1994 | Takata | 257/408 |
| 5,480,524 A | * | 1/1996 | Oeste | 204/158.2 |
| 5,963,810 A | * | 10/1999 | Gardner et al. | 438/287 |
| 5,990,516 A | * | 11/1999 | Momose et al. | 257/327 |
| 2001/0013629 A1 | * | 8/2001 | Bai | 257/411 |

OTHER PUBLICATIONS

"Hafnium tetraiodide HfI$_4$ structure and properties. A new AB$_r$ structure type"; Krebs, B.; Sinram D., Journal of the Less–Common Metals, vol. 76, No. 1–2, pp. 7–16, 1980.

"Hafnium and zirconium silicates for advanced gate dielectrics"; Wilk, G.D.; Wallace, R.M.; Anthony, J.M., Journal of Applied Physics, vol. 87, No. 1, pp. 484–492, 2000.

"Dissociation of zirconium tetraiodide in plasmas", Zhivotov, V.K.; Kalachev, I.A.; Mukhametshina, Z.B.; Nevzorov, A.V.; Rusanov, V.D.; Fridman, A.A.; Chekmarev, A.M.; Yagodin, G.A., Zhurnal Tekhnicheskoi Fiziki, vol. 56, No. 4, pp. 757–759, 1986.

"Atomic layer epitaxy growth of TiN thin films from TiI$_4$ and NH$_3$", Ritala, M.; Leskela, M.; Rauhala, E.; Jokinen, J., Journal of the Electrochemical Society, vol. 145, No. 8, pp. 2914–2920, 1998.

"Halide chemical vapour deposition of Ta$_2$O$_5$", Forsgren, K.; Harsta, A., Thin Solid Films, vol. 343–344, pp. 111–114, 1999.

"CVD of ZrO$_2$ using ZrI$_4$ as metal precursor", Forsgren, K.; Harsta, A., Journal de Physique IV, vol. 9, No. 8, pp. 487–491, 1999.

"Influence of substrate temperature on atomic layer growth and properties of HfO$_2$ thin films", Aarik, J. et al., Elsevier Thin Solid Films 340 (1999), pp. 110–116.

"Atomic Layer Deposition of Titanium Oxide from TiI$_4$ and H$_2$O$_2$", Full Paper, Chemical Vapor Deposition 200, 6, No. 6, Wiley–VCH Verlag GmbH. D–69469 Weinheim, 2000, pp. 303–310.

* cited by examiner

Primary Examiner—Michael S. Lebentritt
(74) Attorney, Agent, or Firm—James L. Clingan, Jr.

(57) ABSTRACT

A hafnium-based dielectric layer, such as hafnium oxide (HfO$_2$), is formed over a semiconductor substrate by flowing a hafnium-containing precursor of hafnium (Hf) and iodine (I) and an oxygen-containing precursor resulting in a high quality dielectric layer over the substrate. In one embodiment, the hafnium-containing precursor is Hafnium tetraiodide (HfI$_4$). The two precursors may be applied simultaneously or alternately. The hafnium tetraiodide may be provided into a reaction chamber via sublimation or direct liquid injection.

25 Claims, 1 Drawing Sheet

METHOD FOR MAKING A HAFNIUM-BASED INSULATING FILM

FIELD OF THE INVENTION

This invention relates to making integrated circuits and more particularly to methods for making hafnium based layers such as hafnium oxide.

BACKGROUND OF THE INVENTION

A variety of different materials have been studied as candidates for future gate dielectrics for advanced integrated circuits. The need for these gate dielectrics having a high dielectric constant (high K) is that the commonly used material silicon oxide needs to be made thinner and thinner in order to achieve the coupling between the gate and the channel that is needed as advances continue. The thinning of the silicon oxide eventually leads to unacceptable gate leakage. Some of the most common high K materials targeted to replace silicon oxide are metal oxides. Some of the more commonly studied metal oxides are zirconium oxide, titanium oxide, and tantalum oxide. These all provide the high K that is needed, but they also introduce additional problems. Commonly, various chemicals are used in the formation of these metal oxides. In the formation of the metal oxide, some of these chemicals leave unwanted byproducts or impurities in the metal oxide itself. This comes about by the nature of using chemical precursors to form the metal oxide. The typical precursor is a metal chloride or metal organic. Often, some chlorine or carbon will remain in the metal oxide. For an insulator, this is particularly undesirable because impurities tend to reduce the insulating characteristics of an insulator.

With respect to zirconium oxide, one of the disadvantages is that the zirconium oxide may react with the gate that overlies the zirconium oxide if that gate is silicon. Silicon is the typical choice for gates. At the anneal temperatures that are required for activating the source/drain are sufficient to cause a reaction between the zirconium oxide and the silicon. Titanium oxide and tantalum oxide actually have the same problem but to an even greater degree. Of course some of the alternatives are to use a metal gate instead of a silicon gate, but this also requires development of the proper choice of the proper gate and the metal gate itself may introduce different problems.

Thus it is shown there is a need for a method of making a high quality high K dielectric material that avoids the problems of zirconium, titanium, and tantalum oxide films.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE INVENTION

Described is a technique for obtaining a hafnium based dielectric with reduced contaminates arising from the precursor which contains the hafnium. By using hafnium tetraiodide, the hafnium is separated easily from the iodine, and the iodine is removed very effectively. The iodine does not penetrate into the hafnium-based film as much as other materials used in combination with the hafnium as the precursor.

Figure 1:
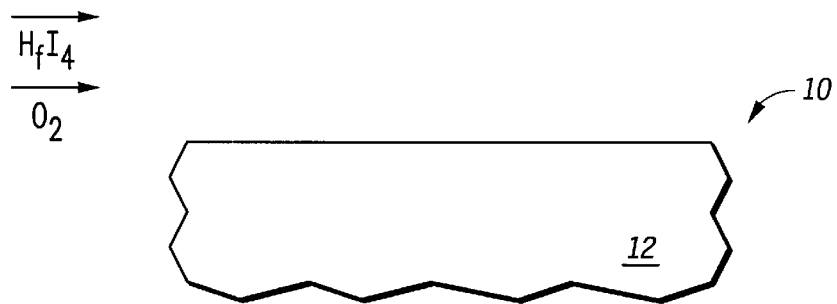
FIG. 1 is a cross-section of a semiconductor device at a first stage in processing according to an embodiment of the invention.

Shown in FIG. 1 is an integrated device structure 10 comprising a substrate 12. Also shown in FIG. 1 are hafnium tetraiodide and oxygen flowing over a surface of substrate 12. These chemicals may be flowing over the surface at the same time or at different times. Substrate 12 is a semiconductor material, typically silicon.

Figure 2:
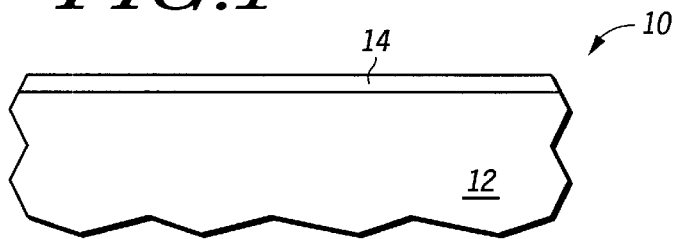
FIG. 2 is a cross-section of the semiconductor device at a processing step subsequent to that shown in FIG. 1.

Shown in FIG. 2 is a hafnium oxide film 14, which has been formed over the surface of substrate 12. In this particular case hafnium oxide film 14 is made up of just hafnium and oxide. However, additional materials may be used in addition to the hafnium and the oxygen. For example, silicon may be included and may be advantageous. Further, the oxygen-containing precursor may be other than oxygen ($O_2$), and may be, for example, water ($H_2O$) or hydrogen peroxide ($H_2O_2$).

Figure 3:
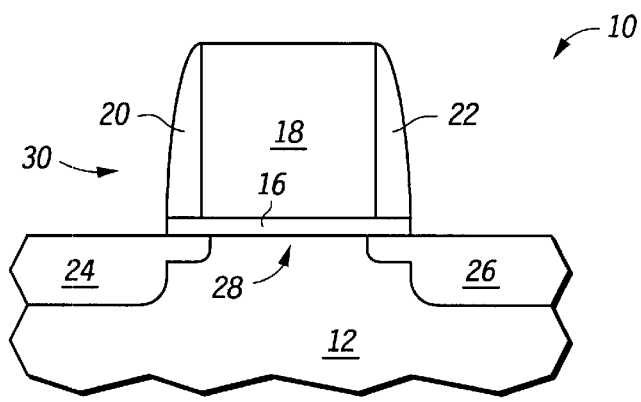
FIG. 3 is a semiconductor device at a subsequent stage in processing to that shown in FIG. 2.

Shown in FIG. 3 is a transistor device using hafnium oxide film 14 as a gate dielectric. Hafnium oxide film 14 has been at least somewhat etched to leave a hafnium oxide film 16 as the gate dielectric. Overlying gate dielectric 16 is a gate 18 and sidewall spacers 20 and 22, which are along the side of gate 18. Adjacent to gate 18 is a source 24 and a drain 26. Between source 24 and drain 26 is a channel 28. This shows a completed transistor 30 that is representative of a conventional transistor with the difference being that it has a gate dielectric 16 formed in a manner that offers improvements over that of the prior art. Gate dielectric 16 has the benefit of less impurities due to the use of the hafnium tetraiodide precursor.

Figure 4:
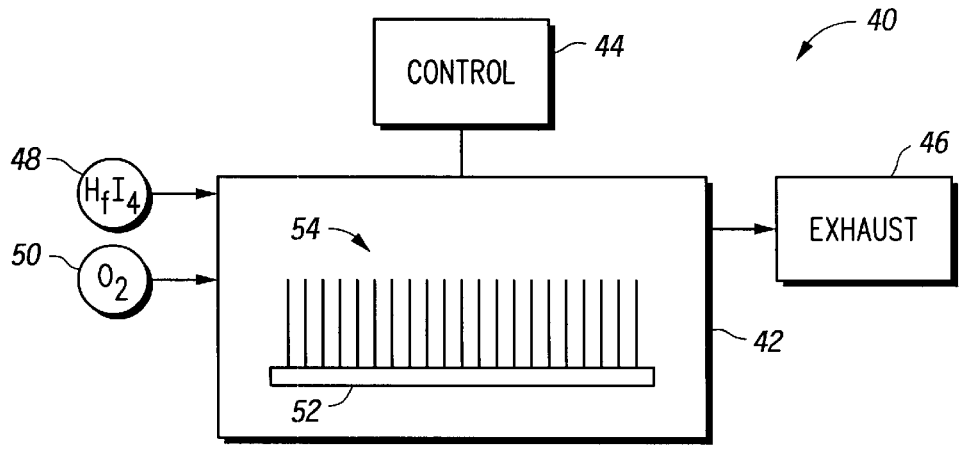
FIG. 4 is an apparatus useful in performing process steps according to the invention.

Shown in FIG. 4 is an apparatus 40 comprised of a reaction chamber 42, a control 44, an exhaust 46, a source 48 of hafnium tetraiodide, and a source 50 of oxygen. Also shown in FIG. 4 is a boat 52 inside reaction chamber 42 carrying a plurality of wafers 54. Apparatus 40 is useful in forming the hafnium oxide film 14. If it were desirable for the hafnium oxide film to also contain another material, such as silicon, there would also be an additional source of that material added to apparatus 40. Apparatus 40 shows a CVD type of deposition in which many wafers can receive the deposition at the same time. In the alternative, another type of apparatus, such as atomic layer deposition (ALD) apparatus, can also be used. The primary difference in FIG. 4 from currently available ALD equipment would be that only one wafer would be processed at one time. Much work is currently being done in developing batch ALD. If that does develop, then the depiction of apparatus 40 of FIG. 4 would also directly apply to such ALD equipment.

In depositing the hafnium oxide, the source of hafnium oxide provides hafnium oxide inside reaction chamber 42 under the control of control 44. Similarly, oxygen is introduced into reaction chamber 42 under the control of control 44. For the case in which hafnium oxide layer 14 is deposited by CVD, the hafnium tetraiodide and the oxygen flow at the same time to deposit approximately 40 Angstroms of hafnium oxide. The source of hafnium tetraiodide 48 is treated to a temperature and pressure to ensure that sublimation of the hafnium tetraiodide occurs. For example, a temperature of 180° Celsius at a pressure of 1 torr is effective. An alternative to sublimation is mixing the hafnium tetraiodide in a solvent. Then the solvent and the hafnium tetraiodide are delivered to reaction chamber 42 through direct liquid injection. The reaction chamber 42 is maintained at a temperature and pressure to ensure that the hafnium separates from the iodine and reacts with the oxygen to form the hafnium oxide film. An effective temperature and pressure for this is 350° Celsius at 1 torr for a deposition rate that provides a high quality film. For a given deposition rate, the amount of time for flowing the oxygen and allowing the sublimated hafnium iodide into reaction chamber 42 will directly effect the thickness of the hafnium oxide. The thickness that is desired is then achieved by selecting the time that the oxygen and hafnium iodine are provided into reaction chamber 42 for such given deposition rate. The deposition rate can be adjusted to a desired rate by adjusting the temperature and pressure.

For an ALD process, the hafnium iodide and the oxygen are alternately flowed into reaction chamber 42 with purging of reaction chamber 42 between these steps. In an ALD process, one of the selected materials is flowed so as to deposit one molecule thickness of that material onto the wafer, and the remaining material is removed through exhaust 46. After that, the other material is flowed to form another molecule thickness and react with the previously deposited layer. The thickness in such a case is determined by the number of cycles that are run. For the case in which another material, such as silicon, is also included, the other material could be alternated in equal amounts or in lesser amounts than the hafnium and oxygen depending upon the desired amount of silicon in the film.

It is significant to the integrity of the deposited film that the byproduct materials from the precursor decomposition or reaction do not appear in the deposited film. This has been very difficult to achieve using chlorides or organics of the metal. The result of this use of chlorine and carbon in the precursor has been that the chlorine and carbon, respectively, have been left in the deposited film. Both chlorine and carbon have the deleterious effect of reducing the insulating characteristics of the film and increasing leakage.

The ability to effectively use hafnium tetraiodide was not predicted based on typical understanding of the ability to transport vaporous molecules of hafnium tetraiodide from a source to a reaction chamber. The calculated vapor pressure curves show low volatility at typical vapor transport conditions that are used in available CVD and ALD reaction chambers. Thus, the effective use of hafnium iodide, especially by sublimation, was not predicted. Sublimation is advantageous over direct liquid injection because the solvent used in direct liquid injection is typically organic which can lead to carbon impurities in the deposited film. One of the explanations for the reduced impurities in the hafnium oxide layer using an iodine-containing precursor is that the iodine is a relatively large atom that does not easily penetrate into the metal oxide. It is significantly larger than carbon and also larger than chlorine. Another possible explanation for this improvement is that the iodine to hafnium bond is weaker than a hafnium to chlorine or carbon bond, thus it is easier to remove iodine from the reaction chamber because it does not cling to the hafnium as much as the chlorine or carbon.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method of forming a semiconductor device, comprising:

placing a semiconductor substrate in a reaction chamber; and forming a dielectric layer over the semiconductor substrate comprising flowing a first precursor comprising Hf and I over the substrate.

2. The method of claim 1, wherein the gate dielectric layer is further characterized as $HfO_2$.

3. The method of claim 1, wherein the precursor is further comprised as $HfI_4$.

4. The method of claim 1, wherein the dielectric layer is further characterized as a gate dielectric layer.

5. The method of claim 4, further comprising:

forming a gate electrode over a second portion of the gate dielectric layer;

removing a first portion of the gate dielectric layer; and forming a source region and a drain region under the gate dielectric layer.

6. The method of claim 5, wherein the gate electrode comprises silicon.

7. The method of claim 1, further comprising flowing a second precursor.

8. The method of claim 7, wherein the second precursor is selected from a group consisting of: $O_2$, $H_2O$, and $H_2O_2$.

9. The method of claim 7, wherein the flowing the second precursor occurs after the flowing the first precursor.

10. The method of claim 9, further comprising purging the reaction chamber after the flowing the first precursor.

11. The method of claim 10, further comprising purging the reaction chamber after the flowing the second precursor.

12. The method of claim 11, wherein the forming the dielectric is performed by atomic layer deposition (ALD).

13. The method of claim 7, wherein the flowing the second precursor occurs while flowing the first precursor.

14. The method of claim 13, wherein the forming the dielectric is performed by chemical vapor deposition (CVD).

15. The method of claim 1, wherein the temperature and pressure of the reaction chamber is chosen at a temperature and pressure where sublimation of the first precursor occurs.

16. The method of claim 1, wherein the first precursor is mixed with a solvent prior to flowing over the substrate.

17. The method of claim 16, wherein the forming the dielectric is performed by direct liquid injection of the first precursor and the solvent.

18. The method of claim 1, wherein before the flowing the first precursor, the first precursor is a solid.

19. The method of claim 1, wherein the method of forming a semiconductor device is a batch process.

20. The method of claim 1, wherein the semiconductor substrate comprises silicon.

21. A method of forming a semiconductor device, comprising:
    placing a semiconductor substrate into a reaction chamber; and
    forming a dielectric layer over the semiconductor substrate comprising
        flowing a first precursor comprising hafnium tetraiodide and a second precursor comprising oxygen.

22. The method of claim 21 wherein the first and second precursors are flowed alternately.

23. The method of claim 21, wherein the first and second precursors are flowed contemporaneously.

24. A method of forming a hafnium-containing layer over a semiconductor substrate, comprising:
    inserting the semiconductor substrate in a reaction chamber;
    providing a solid material comprising hafnium and iodine;
    causing sublimation of a surface of the solid material to provide a gas containing hafnium and iodine;
    transporting the gas containing hafnium and iodine to the reaction chamber; and
    inserting the gas containing hafnium and iodine into the reaction chamber to form a hafnium-containing layer.

25. The method of claim 24 wherein the solid material and the gas containing hafnium and iodine is hafnium tetraiodide.

* * * * *